United States Patent [19]

Larner

[11] 4,187,544
[45] Feb. 5, 1980

[54] AUTOMATED MIXING SYSTEM WITH DISPLAY/DATA ENTRY SUBSYSTEM

[75] Inventor: Michael W. Larner, Mill Valley, Calif.

[73] Assignee: Rubinson & Friends, Inc., San Francisco, Calif.

[21] Appl. No.: 925,741

[22] Filed: Jul. 18, 1978

[51] Int. Cl.² ............................................ H04R 29/00
[52] U.S. Cl. .................. 364/514; 179/1 MN; 324/121 R; 360/13
[58] Field of Search ............ 179/1 MN, 1 N, 1 P, 179/1 B, 1 G, 100.1 R; 324/114, 140, 121; 364/413, 415, 417, 419, 513, 514, 521; 360/18, 22, 31, 25, 66, 79

[56] References Cited

U.S. PATENT DOCUMENTS

| | | | |
|---|---|---|---|
| 3,248,650 | 4/1966 | Bialkowski et al. | 324/121 R |
| 3,345,625 | 10/1967 | Russell et al. | 324/121 R X |
| 3,474,438 | 10/1969 | Lauher | 324/121 R X |
| 3,487,308 | 12/1969 | Johnson | 324/140 R |
| 3,892,921 | 7/1975 | Burkowitz | 179/1 MN |
| 3,919,915 | 11/1975 | Isbell | 360/79 X |
| 3,932,886 | 1/1976 | Olms | 360/13 |
| 4,008,664 | 2/1977 | Crum et al. | 324/140 R X |
| 4,010,492 | 3/1977 | Wood | 360/13 X |
| 4,071,856 | 1/1978 | Kihara et al. | 360/66 X |
| 4,072,851 | 2/1978 | Rose | 324/121 R X |

Primary Examiner—Edward J. Wise
Attorney, Agent, or Firm—Robert B. Block

[57] ABSTRACT

A method of adjusting a mix of a previously recorded multi-track tape by displaying a plurality of fader levels associated with said previously recorded mix of said tape; displaying a plurality of fader levels associated with present levels of fader controls of a recording console; adjusting at least some of said display console fader levels to equal at least some of said corresponding displayed previously recorded fader levels, and in one form of the invention the further step of displaying said previously recorded fader levels and said console fader levels comprising positioning corresponding levels of said previously recorded fader levels in side-by-side relationship with said console fader levels, whereby comparison of said fader levels may be readily accomplished. Suitable apparatus is disclosed to carry out the foregoing.

31 Claims, 12 Drawing Figures

AUTOMATED MIXING SYSTEM WITH DISPLAY/DATA ENTRY SUBSYSTEM

BACKGROUND OF THE INVENTION

1. Field of the Invention

The invention is in the field of automated mixing and display systems utilized in recording studios.

2. Description of the Prior Art

Automated mixing techniques have been utilized in recording studios to produce multi-track tapes of high quality and with a variety of sophisticated mixing options to permit recordation of a wide variety of musical effects. A popular prior art automated mixing system is the Harrison-Allison Automation System. In such a system, a Harrison recording console containing, for example, provisions for as many as forty input mikes is utilized in conjunction with an Allison 65K computer automation programmer to provide for automated mixing. In such systems, fader levels may be adjusted during the mix and these levels are continually scanned and recorded on a data track of the multi-track tape. When the tape is played back, the same Harrison-Allison Automation System enables the fader to be controlled by the data previously recorded. The tape may be updated during the playback mode to change mixing levels and these updated values may then be recorded on the data track of the tape.

A distinct drawback to prior art systems, however, was the fact that although the automation programmer could typically control the VCA (voltage controlled amplifiers) of the individual faders, there was no way to display the digital value associated with these faders to permit the fader attenuators to be manually adjusted to correspond thereto. Consequently, it has heretofore been necessary to adjust the manual attenuator controls for each of the VCA faders utilizing a trial and error technique wherein the engineer listens to the particular mix and continually adjusts the fader attenuators until the desired mix is achieved. Such a process could typically take hours of work.

Another disadvantage of the prior art systems was the lack of any mechanism to store and subsequently retrieve additional data other than that provided by the recording console. Thus, extensive track sheets are typically employed to record setup parameters for the particular mix including, for example, the instrument/track assignments as well as the instrument/console module assignments. If such hard copy track assignments were lost, it is nearly impossible to recreate a particular mix.

SUMMARY OF THE INVENTION

It is an object of the invention to provide a method and apparatus for overcoming the disadvantages of the prior art by providing an improved automated mixing system utilizing a display/data entry apparatus and method.

A further object of the invention is to provide a display/data entry apparatus for utilization with automated mixing systems wherein the display/data entry subsystem is controlled by a microprocessor.

A further object of the invention is to provide a computer controlled display system and interface means for coupling same to an automated mixing/recording apparatus.

Yet another object of the invention is to provide a microprocessor controlled display subsystem including interface means for coupling to an automated recording console of the Harrison-Allison type.

In accordance with the principles of the invention, there is provided a method of adjusting a mix of a previously recorded multi-track tape comprising the steps of displaying a plurality of fader levels associated with said previously recorded mix of said tape, displaying a plurality of fader levels associated with present levels of fader control of a recording console, adjusting at least some of the displayed console fader levels to equal at least some of the corresponding displayed previously recorded fader levels.

Further, there is provided in accordance with the teachings of the invention, display apparatus for an automated mixing/recording system having an automation programmer, a multi-track tape recording unit, and 9 recording console having a plurality of I/O modules thereon and fader setting means associated with each I/O module, the apparatus comprising means for outputting fader level signals corresponding to fader settings of the recording console, and means for outputting fader level signals from previously recorded levels of the fader setting means whereby the previously recorded fader levels may be compared with console fader levels.

There is thus provided apparatus for providing an output of an automated mixing/recording system having an automation programmer, a multi-track tape recording unit, and a recording console having a plurality of I/O modules thereon and fader setting means associated with each I/O module, the apparatus comprising computing means having data storing means, output means connected to said computing means for providing an output thereof, input means for inputting data into said computing means, and interface means for interconnecting said computer means to said automation programmer.

BRIEF DESCRIPTION OF THE DRAWINGS

These and other objects of the invention will become clear in reference to the specification taken in conjunction with the drawings wherein.

DETAILED DESCRIPTION OF THE PREFERRED EMBODIMENT

System Overview

Figure 1:
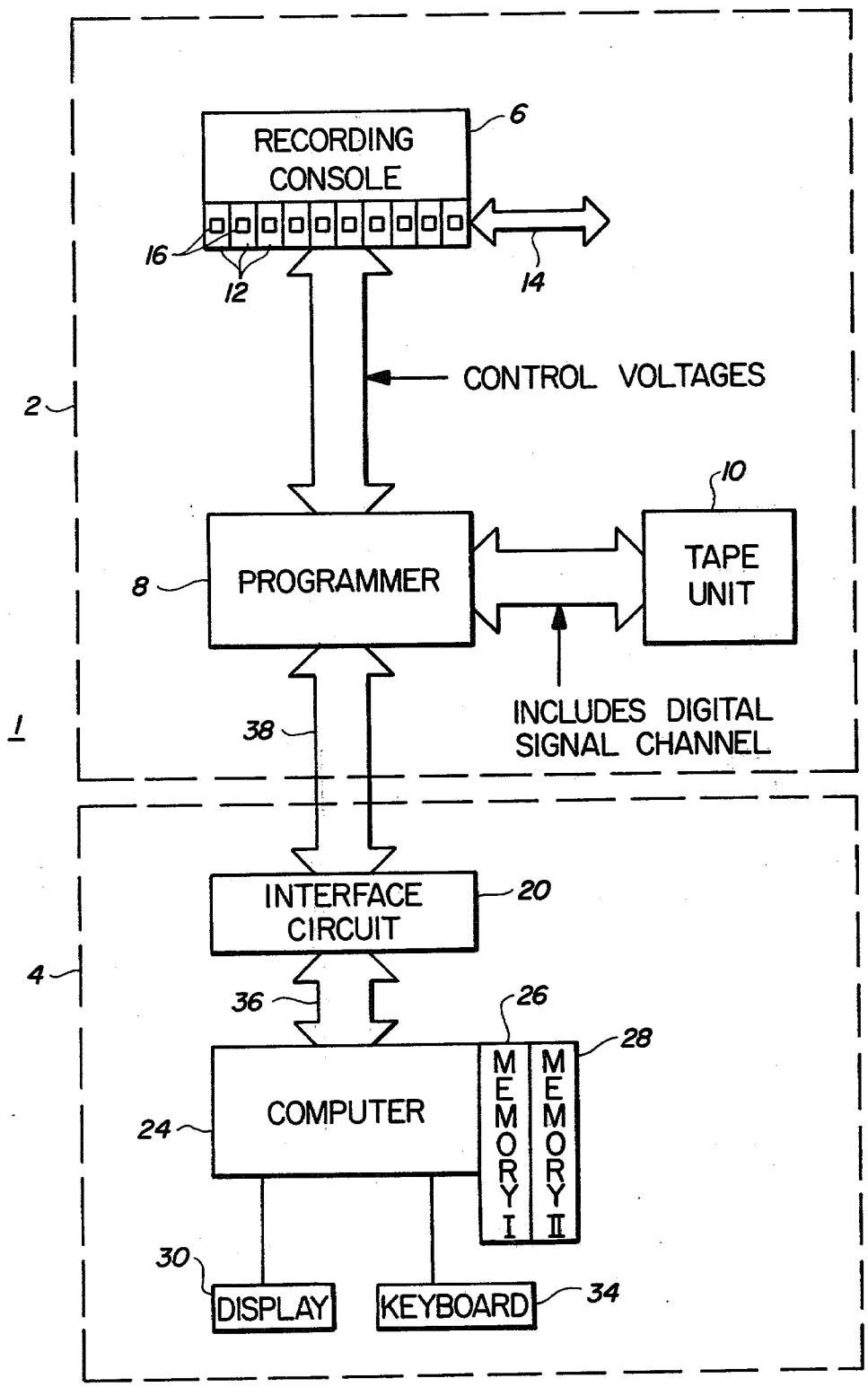
FIG. 1 is a block diagram of the overall automated mixing and display system.

FIG. 1 is a block diagram of the overall automated mixing and display system 1 which comprises an automated mixing subsystem 2 and a display/data entry subsystem 4. The automated mixing subsystem 2 may comprise a conventional mixing apparatus such as those currently utilized in modern day recording studios. The automated mixing subsystem 2 comprises, for example, a recording console 6, automation programmer 8 and tape unit 10. Preferably, the recording console may be one commercially available from Harrison Systems of Nashville, Tennessee such as their Model Number 4032 or 3232. The recording console typically provides a plurality of I/O modules 12 for interconnection to microphone preamplifiers, line drivers, etc. (not shown) along lines 14. Associated with each module 12 is a fader attenuation level control 16 utilized to adjust the amplitude of the input/output signal for its associated module. The console may typically provide forty input lines and thirty-two output lines and may permit, for example, a twenty-four track output assignment for recording on multi-track recorders. The automation programmer 8 may be, for example, an Allison automation programmer (Allison Research, Nashville, Tennessee) used primarily to provide an interface between the recording console 6 and tape unit 10. The automation programmer 8 typically takes care of analog-to-digital and digital-to-analog conversion as well as the tape encoding and decoding of the digital data. The tape unit 10 may also be conventional and comprise an apparatus for recording and reading a multi-track tape. Typically, one track of the tape is utilized to encode the digital data, such as, for example, the fader attenuation level associated with each of the modules 12.

The display/data entry subsystem 4 comprises an interface 20, computer 24, memory units 26 and 28, display 30 and keyboard 34. The computer 24 may be any of a number of well known microprocessors such as, for example, the Z80 manufactured by Zilog of Cupertino, California. The display 30 may typically comprise a CRT which may be an integral unit with the keyboard 34. A plurality of lines 36 interconnect the computer 24 with the interface 20, and similarly a plurality of connecting lines 38 connect the interface 20 with the automation programmer 8.

Although the display 30 is specifically illustrated herein as a CRT type display, it is understood that generally, the display 30 may comprise any output means such as a printer or the like. The CRT utilized herein is most applicable when a nearly instantaneous representation of the fader attenuation level controls 16 on the recording console are desired, for example, to permit quick and easy comparison with corresponding fader levels on the pre-recorded data track of the multi-track tape.

Automated Programmer

Figure 2:
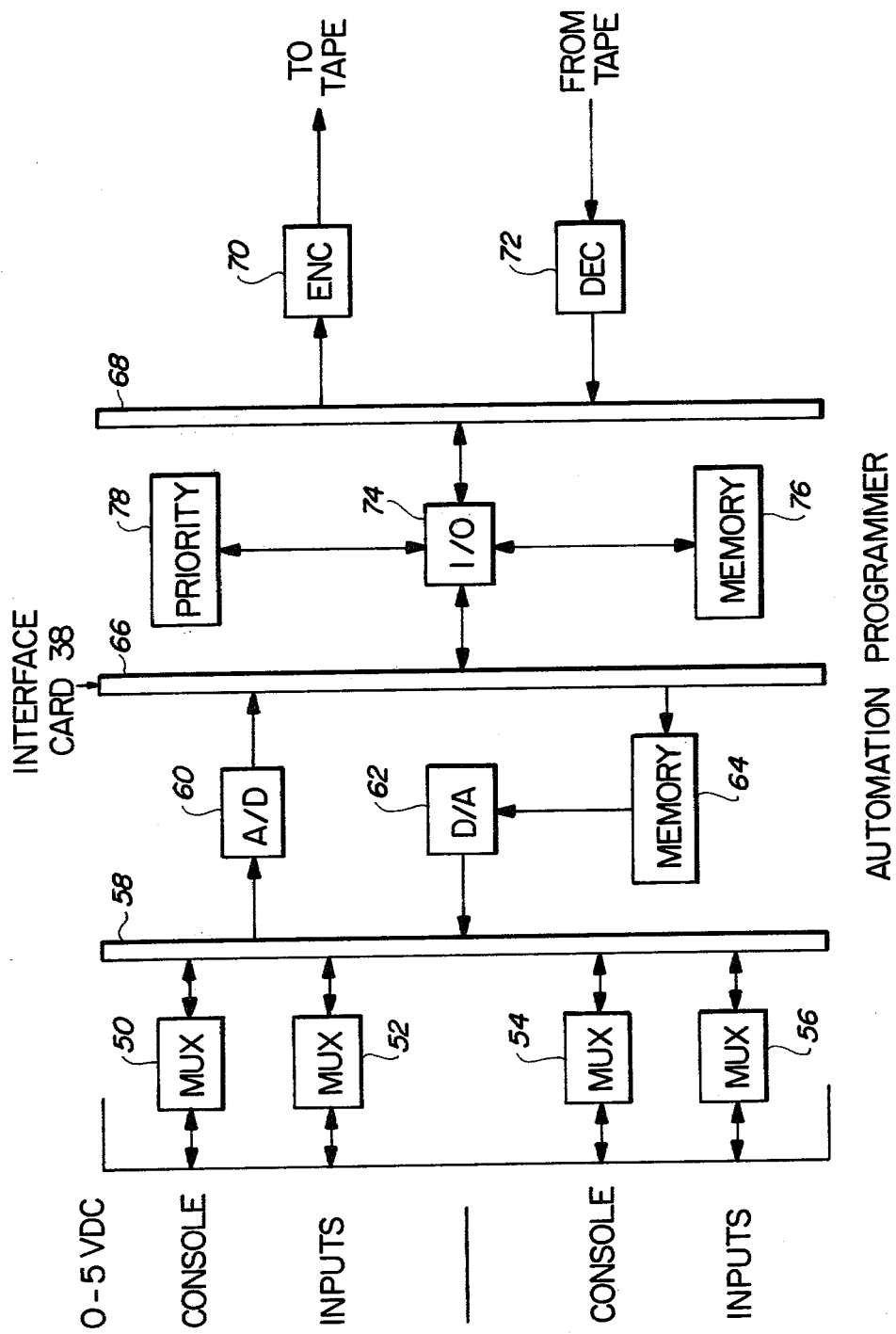
FIG. 2 is a block diagram of the automation programmer.

A more detailed block diagram of the automation programmer 8 is illustrated in FIG. 2. A plurality of multiplexers 50, 52, 54 and 56 interconnect the console input/output lines to a transfer buss 58 which in turn passes the signals either to an analog-to-digital converter 60 for input signals to the tape unit 10 or receives signals from a digital-to-analog converter 62 from the tape unit 10. A memory unit 64 is utilized as a buffer storage for storing data to be fed to the digital-to-analog converter 62.

The inputs and the outputs shown in FIG. 2 represent a plurality of lines going to the recording console 6 through buss 66 and lines 38. Consequently, the automation programmer 8 acts as an encoder/decoder for transferring data to and from the tape unit 10 and either the recording console 6 or the interface circuit 20.

The automation programmer 8 further uses data/control busses 66 and 68 for interconnecting the analog or digital data to an encoder 70 and decoder 72 via an input/output unit 74, a memory storage unit 76 and a priority circuit 78. The memory storage unit 76 basically stores a sequence of operating instructions to sequentially sample the input and enable the output to multiplexers 50, 52, 54 and 56.

Among the lines from the automation programmer 8 to interface 20 are address lines PA0–PA15 (PA=programmer data). Also provided as output lines from the programmer 8 are the encode (ENC) signal along line PA16, the decode signal (DEC) along line PA15 and the data stable(DS) signal along line PA17. Additionally, input lines to the interface 20 are provided by the computer 24. These lines include address lines CA0–CA15 (CA=computer address and data lines CD0–CD15 (CD=computer data). Additional control lines to the computer are also provided such as the buss request, $\overline{BUSRQ}$, and memory write, $\overline{WR}$, signals which are discussed hereinbelow in connection with the detailed operation of the interface circuit 20.

The function of priority circuit 78 is to compare each pair of successive words to determine if there is a change. If there is a change the circuit establishes this as a first priority operation next in order.

Interface—Buss Request

Figure 3:
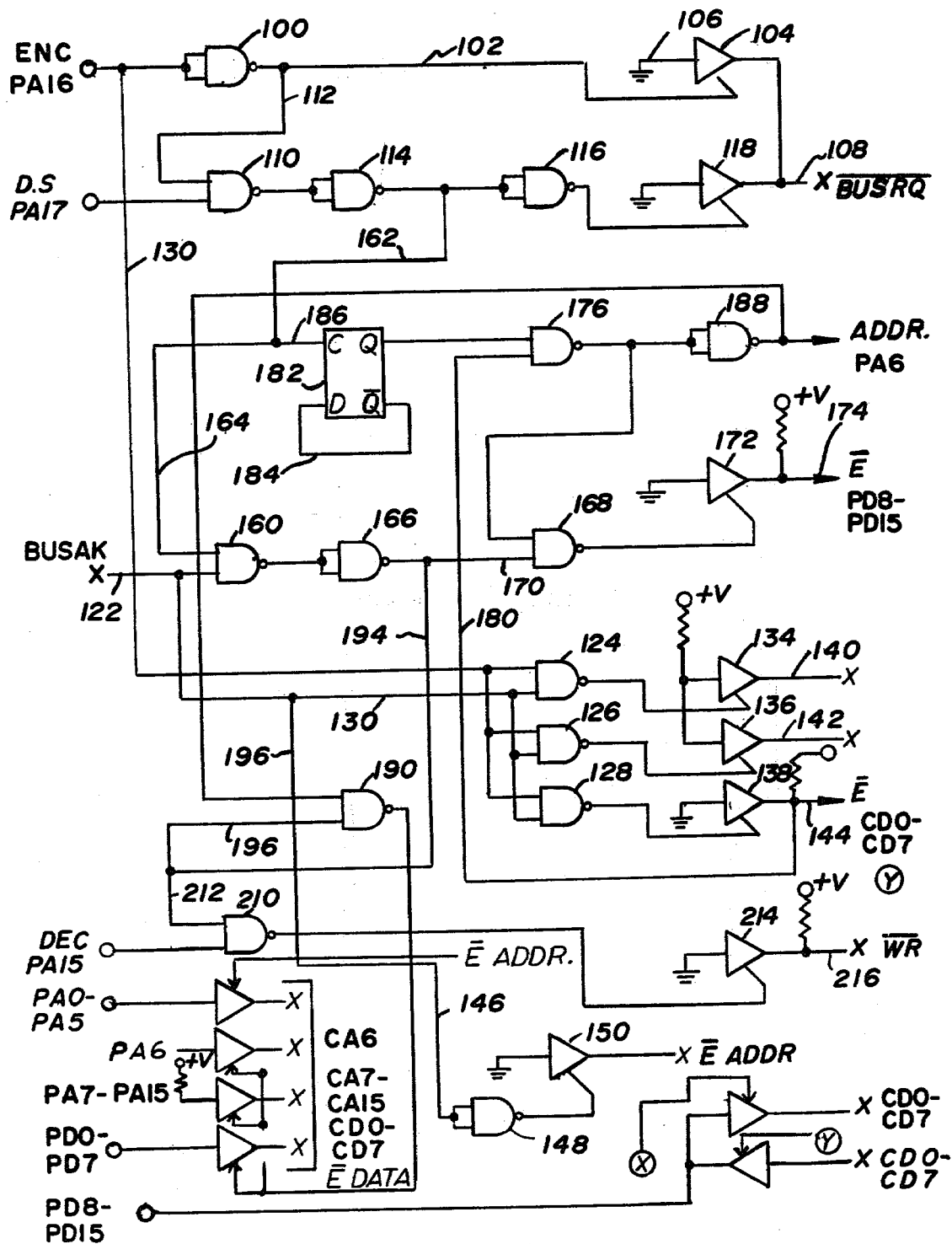
FIG. 3 is a schematic circuit diagram of the interface utilized in the display/data entry subsystem.

A detailed schematic diagram of the interface 20 within the display/data entry subsystem 4 is shown in FIG. 3. A breakdown of the subcircuits of FIG. 3 is illustrated in overlay fashion utilizing FIGS. 3A–3E. The subsystem circuit diagrams of FIGS. 3A–3E facilitates the understanding of the overall circuit shown in FIG. 3 and corresponding elements in these figures are labeled the same as those in FIG. 3.

Figure 3A:
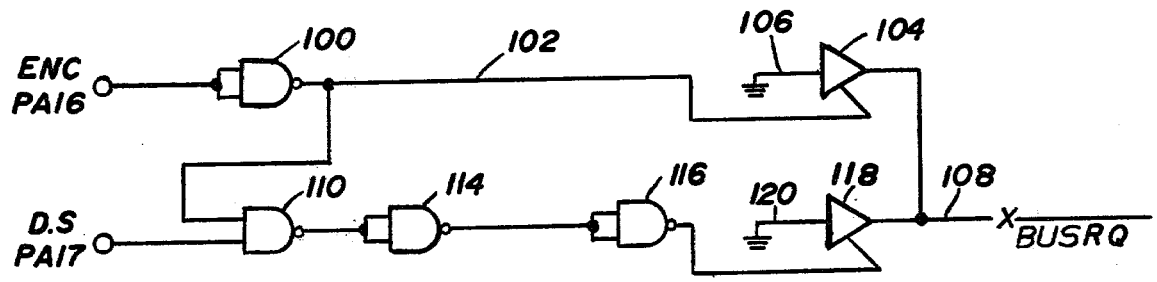
FIGS. 3A–3E illustrate portions of the circuit diagram of FIG. 3 as an aid in the description thereof.

As shown in FIGS. 3 and 3A, the ENC signal (encode signal) is supplied from the automation programmer 8 along line PA16 to both inputs of a NAND gate 100 which functions to invert the input signal. The output of NAND gate 100 is fed along line 102 to the enable or gate input of a tri-state driver 104. The signal input to tri-state driver 104 is grounded along line 106. The output of tri-state driver 104 is connected to line 108 for supplying the $\overline{BUSRQ}$ signal (buss request signal) to the computer 24.

The output of NAND gate 100 is also connected to the upper input of NAND gate 110 via line 112. The second input to NAND gate 110 is supplied by the DS (data stable) signal along line PA17, originating from the automation programmer 8. The output of NAND gate 110 is supplied to both inputs of NAND gate 114 which thus acts as an inverter. The output of NAND gate 114 is supplied to both inputs of NAND gate 116 whose output is connected to the gate input of tri-state driver 118. The signal input of tri-state driver 118 is grounded along line 120. The output of tri-state driver 118 is also connected to line 108 to supply the buss request signal to the computer 24.

The ENC signal supplied by the automation programmer 8 is normally low during a data decoding mode wherein data from the tape unit 10 is decoded via the automation programmer 8 and normally fed to the recording console 6. During such operation, it is desired for the display/data entry subsystem 4 to monitor the data on the tape unit 10 and consequently, a buss request signal is generated during the decode mode. In this decode mode the buss request signal is generated along the second line in FIG. 3A via NAND gates 110, 114, 116 and tri-state driver 118. Specifically, the ENC signal at the input of NAND gate 100 is low which results in a high at the output of NAND gate 100 which feeds the upper input of NAND gate 110. At such time as the data is stable along the data lines of the automation programmer 8 the DS signal goes high which feeds the second input of NAND gate 110. The output of NAND gate 110 is consequently low. This low signal is inverted once via NAND gate 114 and a second time via NAND gate 116 to provide a low signal to the gate input of tri-state driver 118. The low signal consequently enables the input signal of tri-state driver 118 along line 120 (logical zero signal) to be fed out as the buss request, (BUSRQ) signal along line 108.

It is also required to generate the $\overline{\text{BUSRQ}}$ signal when the automation programmer 8 is operating in the encoding mode, i.e. the mode wherein data is written onto the tape unit 10. In this fashion data from the computer 24 may be written onto the tape unit 10 via the automation programmer 8. To provide the $\overline{\text{BUSRQ}}$ signal during this mode, the ENC signal is high (corresponding to an encoding mode of the programmer 8) which results in a low signal along line 102 to the gate input of tri-state driver 104. Consequently, the signal ground input along line 106 to the tri-state driver 104 is passed through along line 108 to supply the required $\overline{\text{BUSRQ}}$ signal.

Interface—Encode Mode

After the buss request signal has been received the computer 24 will complete operation of the current CPU machine cycle and place the CPU address bus, data buss and tri-state output control signals to a high impedance state so that these busses may be utilized by devices other than the CPU of the computer 24. Once the CPU of the computer 24 has relinquished control of these busses a BUSAK signal (buss acknowledge signal) is transmitted by the computer 24 to the interface 20 along line 122. The buss acknowledge signal is utilized in a number of ways as shown in FIGS. 3B and 3C. In FIG. 3B, the BUSAK buss acknowledge signal is utilized together with the ENC signal to enable appropriate encoding gates for transmission of data from the computer 24 to the automation programmer 8. Specifically, BUSAK signal (high when active) is transmitted to a plurality of NAND gates 124, 126 and 128. A second input to these NAND gates is supplied by the ENC signal along line 130. Consequently, during an encoding mode, both the ENC signal and the BUSAK signal are high which generates a low output from each of the NAND gates 124, 126 and 128. The low output of NAND gates 124 and 126 are connected to gate inputs of tri-state drivers 134 and 136. The output of NAND gate 128 is connected to the gate input of tri-state driver 138. The low inputs to each of the tri-state drivers 134, 136 and 138 enable the signal input to be passed through to the output lines of each respective driver. Consequently, tri-state drivers 136 and 136 apply a high output along lines 140 and 142 respectively, whereas tri-state driver 138 passes a low output along line 144. Lines 140 and 142 are connected to the CPU buss lines for defining unused lines so that they are not left floating (buss lines 78 and 47). The output of tri-state driver 138 along line 144 is fed to a plurality of output drivers which may also be tri-state drivers to interconnect data lines of the computer 24 to data lines of the automation programmer 8. The circle around the Y in FIG. 3B is utilized with a similar indication at the bottom of FIG. 3C to graphically represent connection of one such gate, and it is understood that additional line thus provides connection of eight additional data lines. Consequently, the data lines of the computer, lines CD0–CD7 are interconnected to the data lines of the automation programmer 8, namely, lines PD8–PD15. Typically, the data encoded by the automation programmer 8 may be page (text) information data input originally via the keyboard 34 of the display/entry subsystem 4.

Also illustrated in FIG. 3B is the utilization of the BUSAK signal to generate a plurality of control signals which may be required by the computer 24. These control signals are generated by connecting the buss acknowledge signal, BUSAK, via lines 122 and 146 to feed both inputs of a NAND gate 148. The BUSAK signal is consequently inverted to become low which is connected to trigger a tri-state driver 140. Typically, NAND gate 148 is connected to four separate tri-state drivers, only one of which is shown by tri-state driver 150. A particular signal supplied by tri-state driver 150 and utilized hereinafter is the address enable signal, $\overline{\text{E}}$ ADDR. It is important to note that this address enable signal is generated whenever the buss acknowledge signal is high and is not condition upon any other parameter.

Interface—Decode Mode

FIG. 3C illustrates a portion of the interface logic circuit diagram utilized in the decode mode wherein data is written from the tape unit 10 via the automation programmer 8 to the computer 24. FIG. 3D similarly is used in the decode logic data transfer operation. The division between the two figures is primarily one of interconnecting lower and higher order bits from the automation programmer 8 to the computer 24. For example, in the preferred embodiment of the invention, the automation programmer 8 has a sixteen bit data buss(Allison Programmer) whereas the computer 24 has an eight bit data buss(Z80 microprocessor). Consequently, it is necessary to transfer the sixteen bit data word from the automation programmer 8 in two separate groups of eight bits each when inputting data into the computer 24. FIG. 3C shows the key logic components for transmitting the higher order data bits (bits 8–15), whereas FIG. 3D shows the transfer of the lower order data bits (bits 0–7). As shown in FIG. 3C, the buss acknowledge signal, BUSAK signal, along line 122 is fed to the lower input of a NAND gate 160. The upper input of NAND gate 160 is supplied from NAND gate 144 (see FIG. 3A) along lines 162 and 164. During a decode mode of operation, the output of NAND gate 144 is high (logical 1). When BUSAK is returned high, both inputs of NAND gate 160 are high and consequently its output is low. The output of NAND gate 160 is fed to both terminals of NAND gate 166 which inverts the signal and feeds the resulting high signal to the lower input of a NAND gate 168 along line 170. If the upper input of NAND gate 168 is also high, then the output of NAND gate 168 will be low which will gate a tri-state driver 172. When the tri-state driver 172 is enabled by the low signal from NAND gate 168, its input low signal is passed through to its output along line 174. The output along line 174 is indicated by an X within a circle which corresponds to a similar indicia at the bottom of FIG. 3C. Effectively, a low along line 174 enables a plurality of tri-state buffers (only one shown) to pass through information from the databuss of the automation programmer to the data buss of the computer similar to the inverse operation discussed above in relation to the encoding mode of operation. Normally, the output of line 174 is strapped to a high level via interconnecting line 174 to a voltage source indicated as +V via a pullup resistor.

In order for the data to be gated from the automation programmer 8 to the computer 24 via the gate line 174, both inputs of NAND gate 168 must be high. The upper input of NAND gate 168 is connected to the output of NAND gate 176 via a line 178. The lower input of NAND gate 176 is fed from the tri-state driver 138 via a line 180. During the encoding mode of operation of the automation programmer 8, the signal along line 180 is low inasmuch as the output of NAND gate 128 is low (see FIG. 3B). However, during the decode mode of operation, the output of tri-state driver 138 is held high via voltage source +V. Consequently, a high signal appears on line 180 during the decode mode.

The upper input to NAND gate 176 is supplied by the Q output of "D" flip-flop 182. This D flip-flop has its $\overline{Q}$ output interconnected to its D input terminal via a line 184. The C terminal of flip-flop 182 is connected to the output of NAND gate 144 via line 162 and 186. By interconnecting the $\overline{Q}$ output of flip-flop 182 to the D input, the Q output will successively change state after each cycle of operation in response to the signal input along line 186. For example, the Q output will first be high, then low, then high, etc. As a result, the output of NAND gate 176 will alternate between high and low states. When the output of NAND gate 176 is high, this high signal is fed via line 178 to the upper input of NAND gate 168 enabling the operation of tri-state driver 172. This effectively allows data transfer of the higher order bits from the automation programmer 8 to the computer 24. When the output of NAND gate 176 is low, however, NAND gate 168 supplies a high signal to the gate input of tri-state driver 172 inhibiting operation thereof. Further, the output of NAND gate 176 is supplied to both inputs of NAND gate 188 which supplies the computer address line six, CA6, so that this line will alternately be high and low depending upon the transfer of the upper or lower portion of the sixteen bit word from the automation programmer 8 to the computer 24.

It may be seen from FIG. 3C that the outputs along lines 144 and 174 are mutually exclusive. For example, in the enable mode of operation the output along line 144 is a logical zero enabling transfer of data from the computer 24 through the interface 20 to the automation programmer 8 but inhibiting the gate signal from tri-state driver 172 (via NAND gates 176 and 168).

FIG. 3D shows the circuitry utilized for the lower order transfer of the data bits from the automation programmer 8 to the computer 24. The output of NAND gate 188 is connected to the upper input of a NAND gate 190 via line 192. The lower input of NAND gate 190 is connected to the output of NAND gate 166 via lines 194 and 196. The output of NAND gate 166 is effectively conditioned by the ENC and DS signals being high as well as the BUSAK signal being high (see FIGS. 3A and 3C). This means, in effect, that the automation programmer 8 must be in the encoding mode, data must be in the stable state and the buss acknowledge signal must be returned from the computer 24. The upper input to NAND gate 190 will change one time during each data transfer cycle in response to the change of flip-flop 182 via NAND gates 176 and 188 (see FIG. 3C). Consequently, the output of NAND gate 190 will be low only during one portion of a data transfer cycle which is all that is required inasmuch as the higher order bits are transferred during the other portion of the data transfer cycle. The output of NAND gate 190 is consequently fed via a line 198 as the data enable signal, $\overline{E}$ DATA, to a plurality of tri-state drivers 200, 202 and 204. Tri-state driver 200 has an input terminal connected to address line PA6 from the gate 188. Tri-state driver 202 is in practice a plurality of nine separate tri-state drivers, one each corresponding to the automation programmer address lines PA7-PA15. Each of these lines is strapped to a logical high as shown. Similarly, tri-state drivers 204 are in fact a plurality of eight drivers, one each corresponding to the programmer data lines PD0-PD7. An additional tri-state driver is also shown in FIG. 3D, namely, driver 206 which interconnects the address lines of the programmer, PA0-PA5 to the address lines of the computer, address lines CA0-CA5. Tri-state driver 206 is enabled by the E ADDR generated from tri-state driver 150 of FIG. 3B.

Interface—Memory Write

Figure 3E:
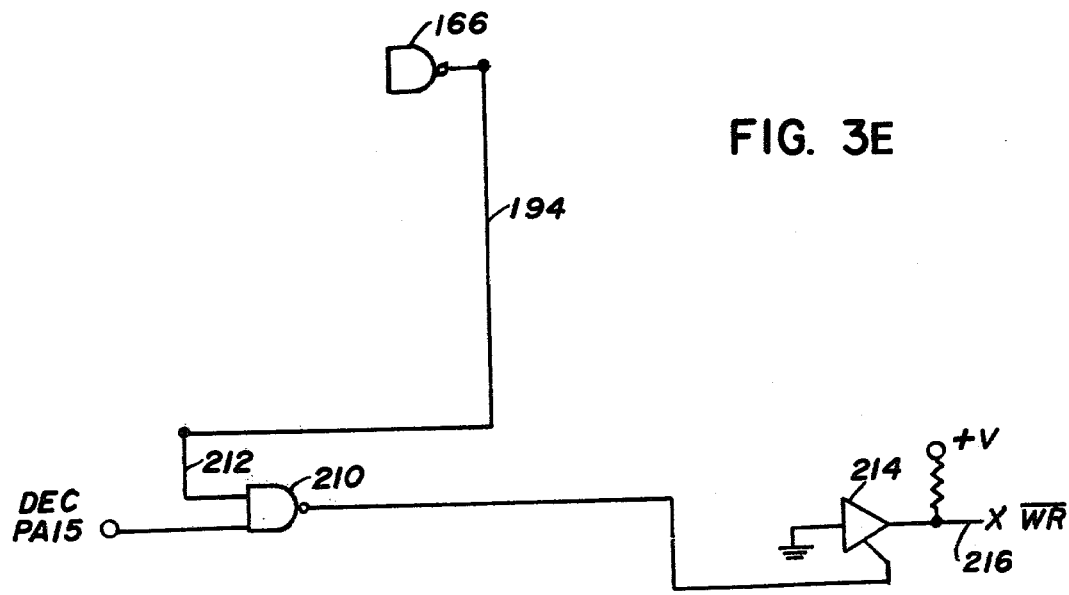
Figure 3B:
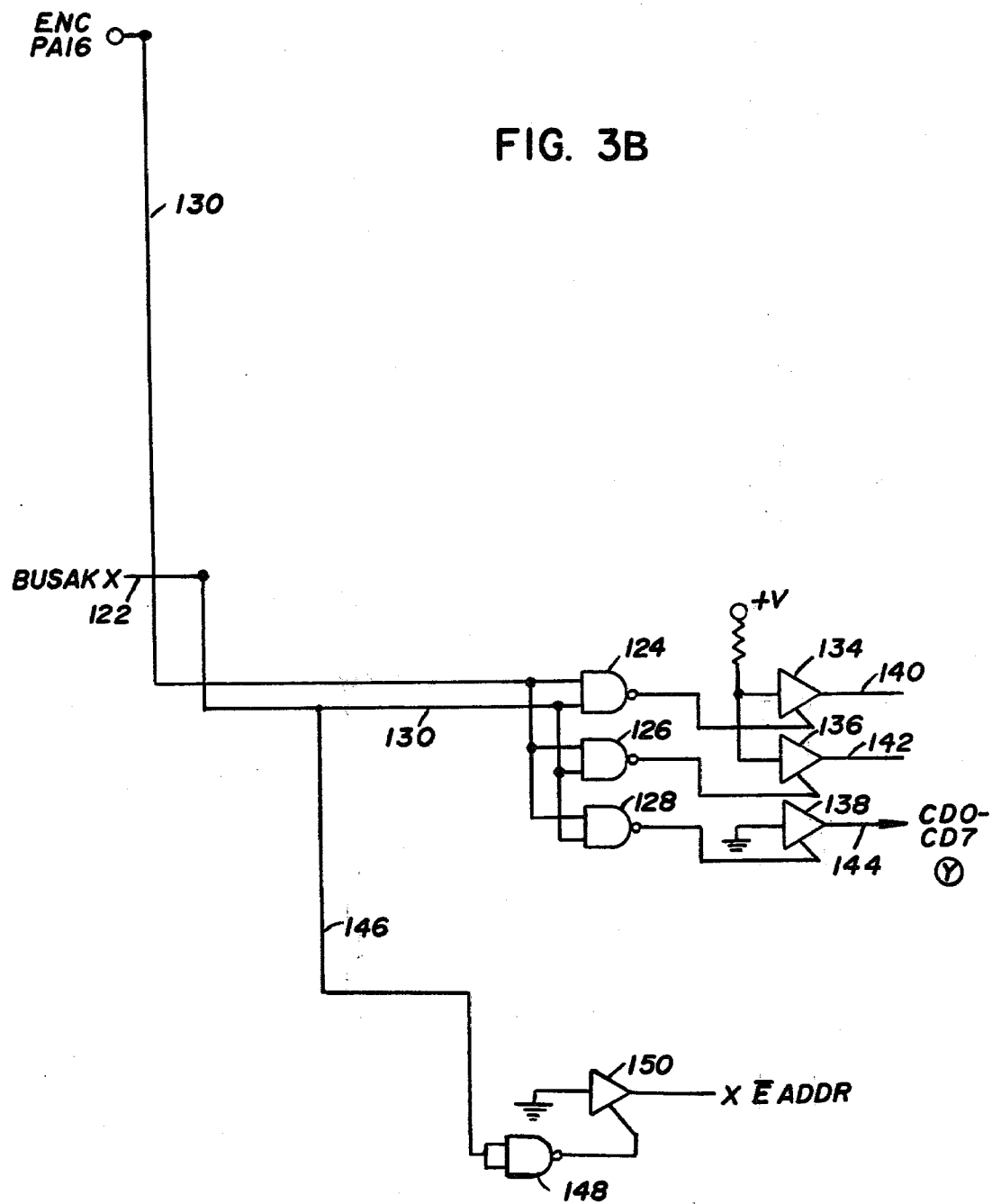
Figure 3C:
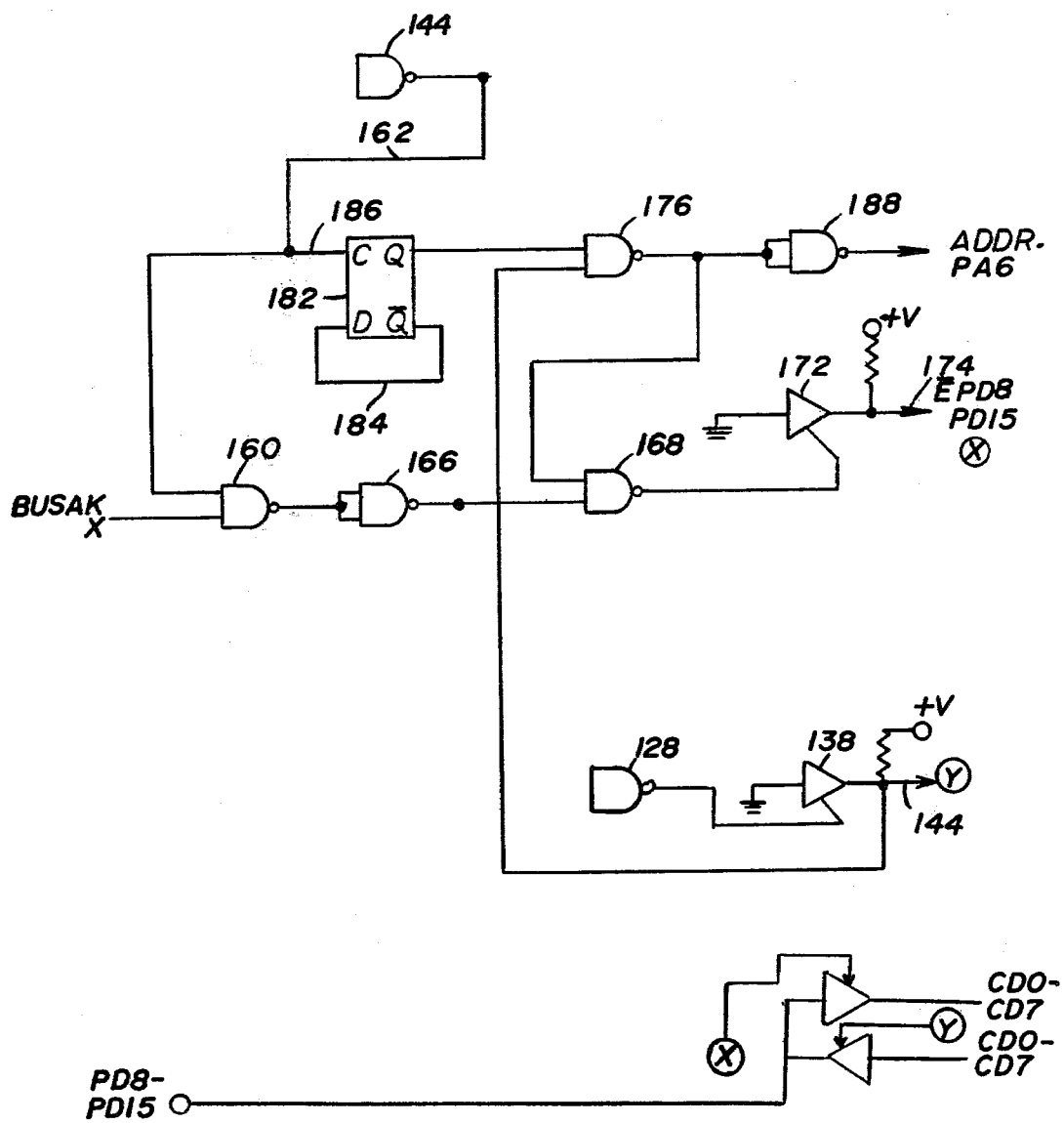
Figure 3D:
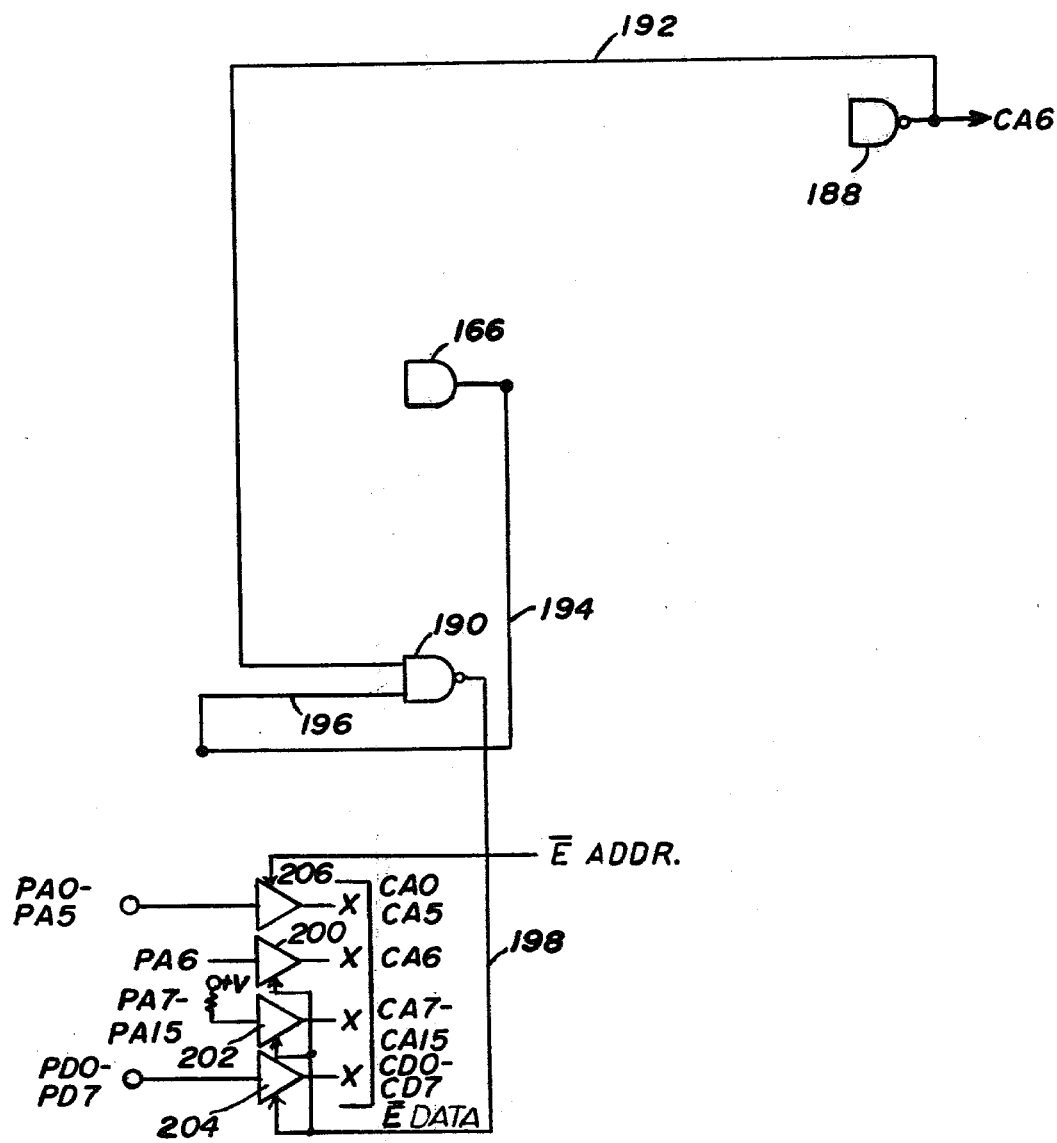

FIG. 3E illustrates the generation of the write command signal to the computer 24. Effectively, it is desired to generate the write signal, $\overline{WR}$, whenever data is to be written into the memory of the computer 24, typically, during a decoding mode of the automation programmer 8. A decode pulse is fed from the line DEC15 of the automation programmer 8 to a NAND gate 210. The second input to NAND gate 210 is supplied by the output of NAND gate 166 along line 194 and 212. The DEC signal is high whenever the automation programmer 8 is in the decode mode. The signal along line 194 and 212 is a high whenever ENC is low, DS is high and BUSAK is high. Thus, the output of NAND gate 166 will be high whenever the automation programmer 8 is not in an encoding mode, data is stable along its data lines, and the computer has returned a buss acknowledge signal. If these conditions are achieved as well as the DEC signal being high, the output of NAND gate 210 will go low to provide a gate signal to a tri-state driver 214. The output of tri-state driver 214 is connected to supply the $\overline{WR}$ input signal to computer 24 via a line 216. The signal along line 216 is normally strapped high to prevent writing operations into the computer 24 except during operation of the tri-state driver 214.

Display—Fader Level Bar Graphs

Figure 4A:
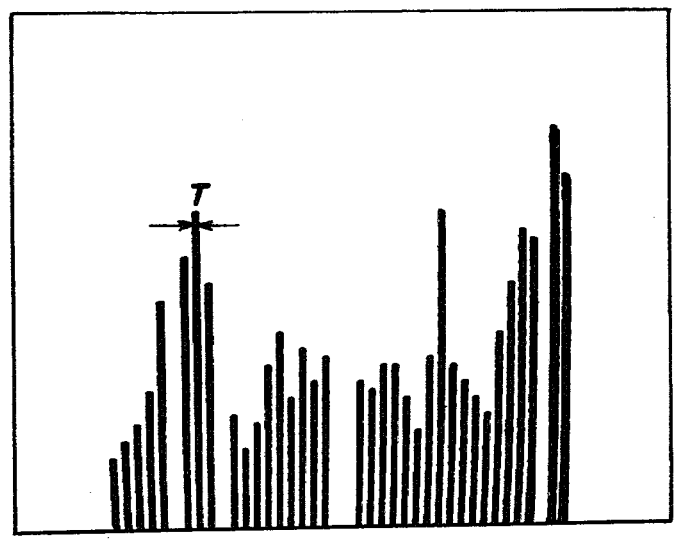
FIGS. 4–4C illustrate the display feature of the display/data entry subsystem in accordance with the teachings of the invention.
Figure 4B:
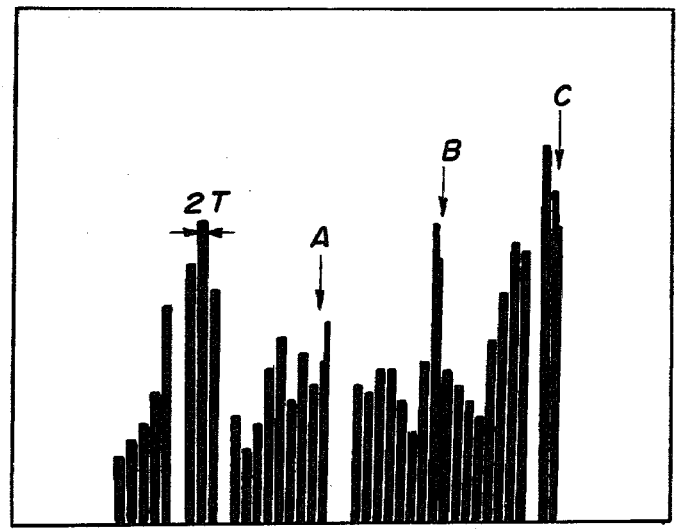
Figure 4C:
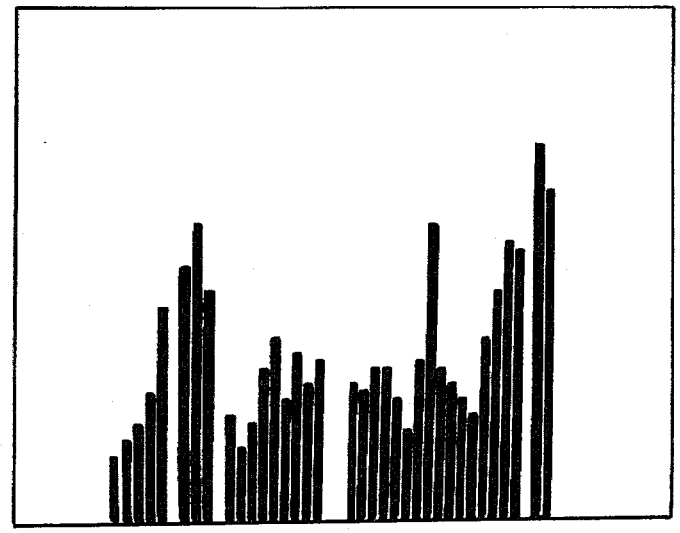

It is thus seen that in operation of the interface 20 appropriate control and gating signals are provided to interconnect data to and from the automation programmer 8 and computer 24. An important function of the computer 24 is to provide a visual display of the fader attenuation level controls 16 associated with each module 12 of the recording console 6. In a typical example, it might be desired to set the fader attenuation level controls on modules 12 to correspond exactly to the previously recorded fader levels on the multi-track tape. This will enable the operator to visually and quickly determine when proper adjustment has been made for each fader. An illustration of operation of the output of the display 30 during this comparison mode of operation is illustrated in FIGS. 4A-4C and a flow chart of the computer operations corresponding to this comparison mode is given in FIG. 5. The display 30 of FIG. 4A is shown as a CRT having a plurality of vertical lines or bars at varying heights. Each line corresponds to a particular module 12 on recording console 6, and the height of each line corresponds to the position or level of the corresponding fader attenuation control 16. The width of each vertical line is the same and may be arbitrarily set so that the lines may be readily distinguishable and have room for adjacent contiguous parallel lines as shown in FIG. 4B. For example, assuming that the width of the lines in FIG. 4A is given by the value t, then the width of the lines in FIG. 4B is typically given by the value 2t. A comparison program of computer 24 is written to allow a direct comparison of the fader levels presently set on the recording console 6 with those read from the tape unit 10. Assuming then, for example, that the fader levels which appear in FIG. 4A are those which were read from the multi-track tape via tape unit 10, FIG. 4B illustrates the console fader levels by vertical lines positioned to the right of each corresponding line in FIG. 4A. As can be seen in FIG. 4B, most of these fader positions match up and are on the same level as those which appeared on the tape, and thus the width of each bar in FIG. 4B appears as 2t. Three such levels, however, do not match as indicated at points A, B and C. By utilizing the comparison program, the operator may readily match the unmatched points at A, B and C to derive the results as shown in FIG. 4C.

Figure 5:
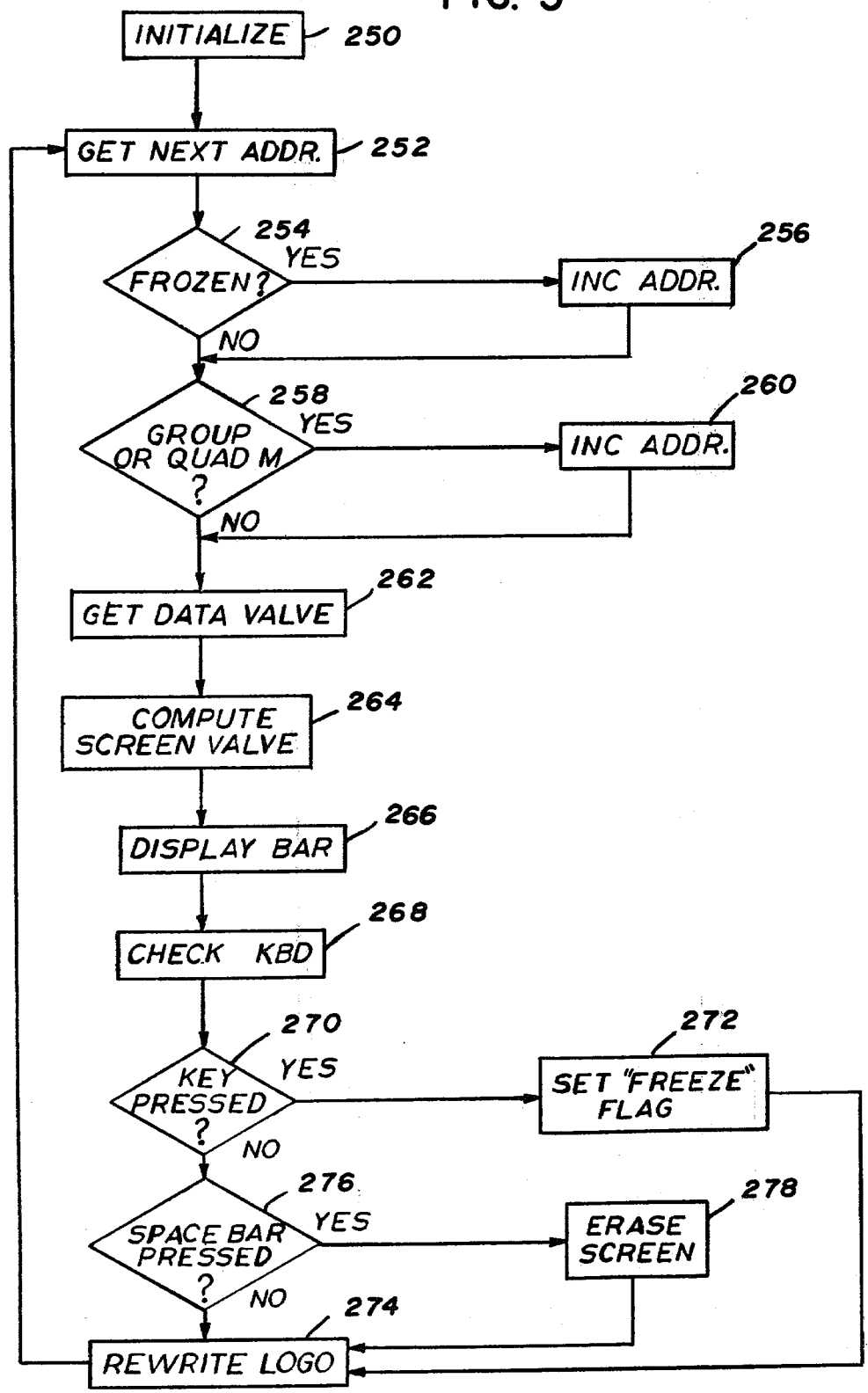
FIG. 5 is a flow chart depicting the comparison mode of operation of the display/data entry subsystem.

The comparison program flow chart is shown in FIG. 5. The program is first initialized at step 250 which resets starting parameters and zeros counters etc. Step 252 obtains the address, typically the next address inasmuch as the program will move around in a loop until the display is erased. The starting address is set up during the initialization step 250. After the address is obtained from the memory (memories 26 and/or 28) of the computer 24, step 254 determines whether the display has been "frozen". The display is frozen whenever one wishes to look at the particular fader levels at any given instant in time which appears on the multi-track tape and have these fader levels displayed in a continuous fashion. If the fader levels from the tape unit were not frozen, then in practice, these levels could change as the tape is being run. Consequently, freezing a picture of the fader levels at any given instant of time allows one to set the recording console faders (attenuation controls) to correspond to the pre-recorded fader levels of the multi-track tape. Freezing the fader levels for display purposes simply entails storing the value of the fader levels of the tape in the memories 26 and 28 of the computer 24 at any given instant of time. If the display is already frozen, then one typically wants to display the console fader level presently under consideration at a position adjacent the "frozen" level. This means that the computer goes to step 256 to increment the address so that the address now corresponds to a position to the right of the displayed frozen level. If the display has not already been frozen, then the program proceeds to step 258. In this step, the program ascertains whether the particular fader is a group or quad master. Faders 41 and 42 of the recording console 6 are typically assigned the group and quad master position. If these fader levels are presently being displayed, then the program proceeds to step 262 to increment the address by two positions so as to place these displayed vertical bars further to the right to separate them from the remaining forty levels for ease of identification. After step 258 (or step 260) the program proceeds to step 262 to actually obtain and extract the data level (value) from the address which was obtained in step 252. The raw data level is first converted by appropriately scaling the value to fit on the display. The scale computation takes place in step 264 after which the program proceeds to actually display the fader level. During the display bar 266, the displayed value is stored in video memory for refreshing the display. The program then proceeds to step 268 to examine the keyboard to determine if any keys have been pressed. Depression of any key during this mode of operation results in the setting of the freeze flag as per step 272. Thus, if a key has been depressed at step 270, the freeze flag will be set during step 272 and the program will proceed to step 274 which rewrites the logo ("THE AUTOMATT") and proceeds to step 252. If no keys have been depressed (which may occur if the freeze flag had already been set during a previous loop) the program proceeds to step 276 to examine whether the space bar on the keyboard has been depressed. If the space bar is depressed an erase routine is entered into in step 278 to erase the entire screen after which a rewrite of the logo occurs as per step 274. If the space bar has not been depressed, then no erasure takes place and the program loops once again to the logo rewrite routine at step 274 and back to obtain another address at step 252 for further display.

Display—Text Information

Another important feature of the display/data entry subsystem 4 in combination with the automated mixing subsystem 2 is the ability to store text information on the data track of the tape. In typical automated mixing subsystems, one must prepare and carefully file away extensive track sheets recording the particular setup parameters associated with the recorded mix. For example, information such as which instrument appeared at which track on the multi-track tape, must be retained in hard copy if the particular recording is to be utilized for further mix updates. With the facility of the display 30 and keyboard 32, the display/data entry subsystem 4 permits one to readily store all such vital setup parameters directly on the track of the multi-track tape. In particular, the very same track utilized for fader level storage by the automation programmer 8 in existing automated mixing subsystems 2 may be utilized to store all such setup parameters. For example, for an automated mixing subsystem 2 of the Harrison-Allison Automation type, roughly one-third of the data track information is utilized to designate module console information for all of the console modules and another one-third of the data track is utilized to designate address identifying the particular faders. Roughly, one-third of the data track goes unutilized. In accordance with the principles of the invention, the display/data entry subsystem 4 utilizes the same data track to store several pages of information which effectively eliminates hard copy storage and filing of track sheets with the subsequent risk of loss associated therewith. In this manner, as long as the multi-track tape unit itself can be found, then all pertinent information relating to the instrument-module-track assignments may be displayed on the display 30 utilizing keyboard commands from the keyboard 30.

A representative detailed example of such display information is set forth hereinafter. Page 1 of the display may be utilized to store track information. Thus, information associating a particular track with the instrument, microphone and possibly even the musician's name (utilizing appropriate abbreviations) can be stored. Additionally, such information as data, title, engineers and producers, i.e. a personnel roster, may be stored. This information may further be updated via the keyboard and computer 24 as, for example, during overdubbing operations to add an instrument and the like. The second page of the display may be utilized to store lyrics of a song as well as publishing information, song writer, producer, music company, etc. On page 3 of the display, one typically stores information such as which instrument is associated with which module 12 of the recording console 6. Additionally, group masters may be defined as well as any other pertinent parameters. With such data stored, it is impossible to recreate a mix by merely playing back data which appears on the data track of the multi-track tape unit through the interface 20 and computer 24 onto the display 30. For example, one may finish a particular mix and not pick it up again for a year later when it is desired to make some modification, such as, deleting the voice track. By merely displaying page 3, for example, one may make the appropriate console assignments, take out the vocals and run the desired copy. In such a situation, the automation programmer automatically controls the VCA faders to permit the desired tape to be readily produced.

In the same example, if it is desired to change a particular mix, one may utilize the display 30 to freeze the mix as appears on the tape at any particular time and adjust the console faders 16 to correspond thereto. Thus, a new mix may be set to correspond to a particular mix at any portion of the run without resorting to a trial and error technique heretofore necessary to achieve the appropriate matching.

Autoscreen Circuitry Program

In the course of the operation of the Z80 computer system in accordance with this invention, ROM memory 24, a program for carrying out the various steps, is entered in suitable language into ROM memory 24. This program is permanently stored in the memory and forms its interconnection and instruction base. It is given here in assembly language program (mnemonic listing) for the autoscreen bar graph display as follows:

```
        Ld HL, OC900H
        Ld FF77, HL
        Call SHFT           ST
        Ld HL, OFFBFH
        Inc L               NXADD
        Ld A, L
        CP EA
        JR Z, ST
        SUB OAOH
        Ld E, A
        SLA, E
        Push HL
        ADD HL, DE
        Ld A, L
        CP 78H
        JR Z, +3
        CP 7BH
        JR Z, +3
        JR CONT
        Add 3H              +3
        Ld C, A
        Pop HL
        Ld, A (HL)
        Sub 3FH
        JR DATA
        Ld C, A             CONT
        Pop HL
        Ld A, (HL)
        SRL A               DATA
        Add 9DH
        Push HL
        CP 0D1H
```

-continued
```
        JRNC BP
        CP 0A4H
        JRNC ZONE
        Ld B, 2EH
        Push BC
        JR CUP
        Ld B, 2EH           ZONE
        Push BC
        JR C/UD
        CMA                 BP
        Ld B, A
        Push BC
        Call CMPR           C/UD
        JR Z STG
        Ld A, E
        Pop BC              EUP2
        Dec B
        Push BC
        Call CMPR           CUP
        JRZ DONE
        Ld A, E
        XOR (HL)
        CMA
        Ld(HL), A
        JR EUP2
        Ld A, E             STG
        And A (HL)
        Ld(HL), A
        Pop BC
        Inc B
        Push BC
        LdA, B
        CP 2FH
        JRZ DONE
        Call CMPR
        JR Z STG
        Pop BC              DONE
        Pop HL
        JR NXADD
        Call WMHL           CMPR
        Call TGT
        CMA
        LdE, A
        Or A, (HL)
        CMA
        OrA, A
        Return
        EXX                 DLY
        Dec B
        EXX
        JR NZ INP
        Call Logo
        In 0E1H             INP
        And 01H
        RNZ
        In 0E0H
        And 7FH
        CP 20H
        JRZ ERASE
        LdA, 0CH
        Ld 0FF77H, A        STF
        Return
        Call CLR            ERASE
        XOR A
        JR STF
```

References

In order to keep the present application within reasonable limits, already available detailed data regarding the programmer 8 and recording console 6 have not been given. Reference is made to the following publications which describe these units in detail. These references are available from the sources below indicated.

(1) Allison Research Inc. 65k Programmer Technical Overview, dated September 1976 four pages
(2) Reprint entitled "The Allison 'Memory Plus System'" from the March/April 1976 issue of R-e/p (3) A brochure published by Harrison Systems of Nashville, Tennessee, entitled "Models 4032 and 3232 Master Recording Consoles"

These materials are attached hereto as exhibits and are incorporated herein by reference. The priority and coding data in the operation of the Allison programmer are set forth in the attached materials and have not been further set forth in the present application.

(4) Lastly, it is believed the Zilog Z-80 CPU and associated computer systems are sufficiently well known as to not require further amplification or inclusion of brochure, the same being available from Zilog of Cupertino, California.

What is claimed is:

1. A method of adjusting a mix of a previously recorded multi-track tape comprising the steps of:
   (a) displaying a plurality of fader levels associated with said previously recorded mix of said tape;
   (b) displaying a plurality of fader levels associated with present levels of fader controls of a recording console; and
   (c) adjusting at least some of said display console fader levels to equal at least some of said corresponding displayed previously recorded fader levels.

2. A method as recited in claim 1 wherein the step of displaying said previously recorded fader levels and said console fader levels comprises positioning corresponding levels of said previously recorded fader levels in side-by-side relationship with said console fader levels, whereby comparison of said fader levels may be reaily accomplished.

3. A method as recited in claim 1 or 2 wherein said step of displaying said previously recorded fader levels and said console fader levels comprises the step of displaying said levels in the form of a bar graph wherein line segments represent the magnitude of said fader levels.

4. A method as recited in claim 1 or 2 wherein the steps of displaying said previously recorded fader levels and said console fader levels comprises displaying said fader levels using a CRT-type display.

5. A method as recited in claim 1 further comprising the steps of:
   (a) entering instrument/track/console data onto said multi-track at the time of said previous recording; and
   (b) displaying said instrument/track/console data prior to said adjusting step to facilitate setup of said console.

6. A method as recited in claim 5 further comprising the steps of:
   (a) entering song lyrics onto said multitrack tape at the time of said previous recording; and
   (b) displaying said song lyrics during said recording step.

7. A method as recited in claim 6 wherein all of said displaying steps comprise displaying on a CRT-type device.

8. Apparatus for an automated mixing-recording system having an automation programmer, a multi-track tape recording unit, and a recording console having a plurality of I/O modules thereon and fader setting means associated with each I/O module, said apparatus comprising:
   (a) means for outputting fader level signals corresponding to fader settings of fader setting means of said recording console; and
   (b) means for outputting fader level signals from previously recorded levels of said fader setting means; whereby said previously recorded fader levels may be compared with console fader levels.

9. Apparatus for an automated mixing-recording system having an automation programmer, a multi-track tape recording unit, and a recording console having a plurality of I/O modules thereon and fader setting means associated with each I/O module, said apparatus comprising:
   (a) display means for displaying fader levels corresponding to fader setting means of said console I/O modules and for displaying fader levels previously recorded on a multi-track tape, said automation programmer providing console fader level data signals from said console and said multi-track tape recording unit; and
   (b) interface means connected between said programmer and said display means for interconnecting same;
   whereby representation of said console and previously recorded data signals may be displayed on said display means.

10. Apparatus as recited in claim 9 wherein said interface means comprises:
    (a) an interface circuit for connection to said programmer;
    (b) a microprocessor including memory storage means for storing said data signals, said microprocessor connected to said interface circuit; and
    (c) said display means connected to said microprocessor.

11. Apparatus as recited in claim 9 or 10 wherein said display means comprises means for displaying bar graph of said console and previously recorded fader levels.

12. Apparatus as recited in claim 11 wherein said display means comprises a CRT-type display.

13. Apparatus as recited in claim 10 further comprising input means connected to said microprocessor for inputting additional data signals into said memory storage means.

14. Apparatus as recited in claim 13 wherein said input means comprises a keyboard.

15. Apparatus as recited in claim 14 wherein said keyboard is adapted for inputting additional data signals corresponding to alphanumeric representations including instrument/track assignments and instrument/I/O module assignments.

16. Apparatus as recited in claim 10 wherein said memory storage means of said microprocessor stores a comparison display program and said microprocessor controls said display means for displaying a representation of each console fader level and an adjacent line representation of each corresponding previously recorded fader level, the length of each line representation corresponding to the value of its respective fader.

17. Apparatus as recited in claim 16 wherein said display means comprises a CRT-type display.

18. Apparatus as recited in claim 17 wherein said line representations are in the form of a vertical bar graph.

19. Apparatus as recited in claim 9 or 16 wherein console fader values are cyclically sampled by said programmer for cyclically supplying corresponding console fader data signals, said interface circuit and microprocessor cyclically connecting said console fader data signals to said memory storage means for updating said display means.

20. Apparatus as recited in claim 19 wherein said previously recorded fader data signals are sampled by said programmer at a particular point on said multitrack tape, said memory storage means storing said previously recorded fader data signals for providing a steady display of fader values corresponding thereto.

21. Apparatus as recited in claim 20 wherein said display means comprises a CRT-type display.

22. Apparatus as recited in claim 20 further comprising input means connected to said microprocessor for inputting additional data signals into said memory storage means.

23. Apparatus as recited in claim 22 wherein said input means comprises a keyboard.

24. Apparatus as recited in claim 23 wherein said keyboard is adapted for inputting additional data signals corresponding to alphanumeric representations including instrument/track assignments and instrument/I/O module assignments.

25. Apparatus as recited in claim 23 wherein said display means comprises a CRT-type display.

26. Apparatus for an automated mixing-recording system having an automation programmer, a multitrack tape recording unit, and a recording console having a plurality of I/O modules thereon and fader setting means associated with each I/O module, said apparatus comprising:

(a) an interface circuit connected to said programmer;

(b) a computing means having data storage means connected to said interface circuit;

(c) text input means connected to said computing means for inputting alphanumeric text data signals thereto;

(d) said computing means providing text output data signals to said interface circuit corresponding to said input text data signals for encoding and recording said text output data signals onto said multi-track tape by said programmer.

(e) output means for providing an output from said computing means;

(f) said interface circuit providing tape data input signals to said computing means corresponding to decoded recorded text data signals; and (g) said computing means controlling said output means for outputting said tape data input signals to provide a visual output thereof.

27. Apparatus as recited in claim 26 wherein said output means comprises a display means.

28. Apparatus as recited in claim 27 wherein said display means comprises a CRT-type display.

29. Apparatus as recited in claim 26 wherein said text input means comprises a keyboard.

30. Apparatus as recited in claim 29 wherein said text data signals comprise representations of instrument/I/O module assignments and instrument/track assignments.

31. Apparatus as recited in claim 30 wherein said text data signals comprise representations of song lyrics.

* * * * *